United States Patent [19]

Zeh

[11] Patent Number: 4,764,719
[45] Date of Patent: Aug. 16, 1988

[54] ELECTRO-LUMINESCENT AUTOMATIC TESTING APPARATUS AND METHOD FOR CERAMIC SUBSTRATES, PRINTED CIRCUIT BOARDS AND LIKE ITEMS WITH BACKGROUND ILLUMINATION SUPPRESSION

[75] Inventor: Robert M. Zeh, East Berne, N.Y.
[73] Assignee: Testamatic Corporation, Scotia, N.Y.
[21] Appl. No.: 901,595
[22] Filed: Aug. 29, 1986
[51] Int. Cl.[4] .............................................. G01R 31/02
[52] U.S. Cl. .............................. 324/73 PC; 324/501; 324/539
[58] Field of Search ............ 324/73 PC, 51, 52, 158 F

[56] References Cited

U.S. PATENT DOCUMENTS

| | | | |
|---|---|---|---|
| 4,169,244 | 9/1979 | Plows | 324/158 R |
| 4,507,605 | 3/1985 | Geisel | 324/73 PC |
| 4,527,119 | 7/1985 | Rogers et al. | 324/158 F |

OTHER PUBLICATIONS

Horowitz et al., *The Art of Electronics*, pp. 410–413.

*Primary Examiner*—Reinhard J. Eisenzopf
*Assistant Examiner*—Stephen M. Baker
*Attorney, Agent, or Firm*—Charles W. Helzer

[57] ABSTRACT

An automatic, electro-optical testing apparatus which employs electro-luminescence for the testing of items such as printed circuit boards, ceramic substrates and the like for electrical continuity. A unipotential array of conductor wires lying in substantially the same plane is supported within a sealable test chamber over an item under test to develop a desired electric field between exposed conductive surfaces of the item under test and the unipotential array of parallel conductors. Electro-luminescence is produced in a gaseous atmosphere within the sealable test chamber around test points contacted by a movable probe and around all conductive parts on the item under test and having electrical continuity with the test point contacted by the movable probe. The invention thus comprised eliminates the source of undesired background noise illumination while maintaining all of the transparent parallel conductor grid wires of a unipotential array at the same electric potential. This feature in conjunction with scanning with an automatic electro-optical scanning photometer in desired scanning paths parallel to the axes of the unipotential array of conductor wires reduces to a minimum the possibility of error occurring in the test results by reason of undesired background light noise illumination.

7 Claims, 3 Drawing Sheets

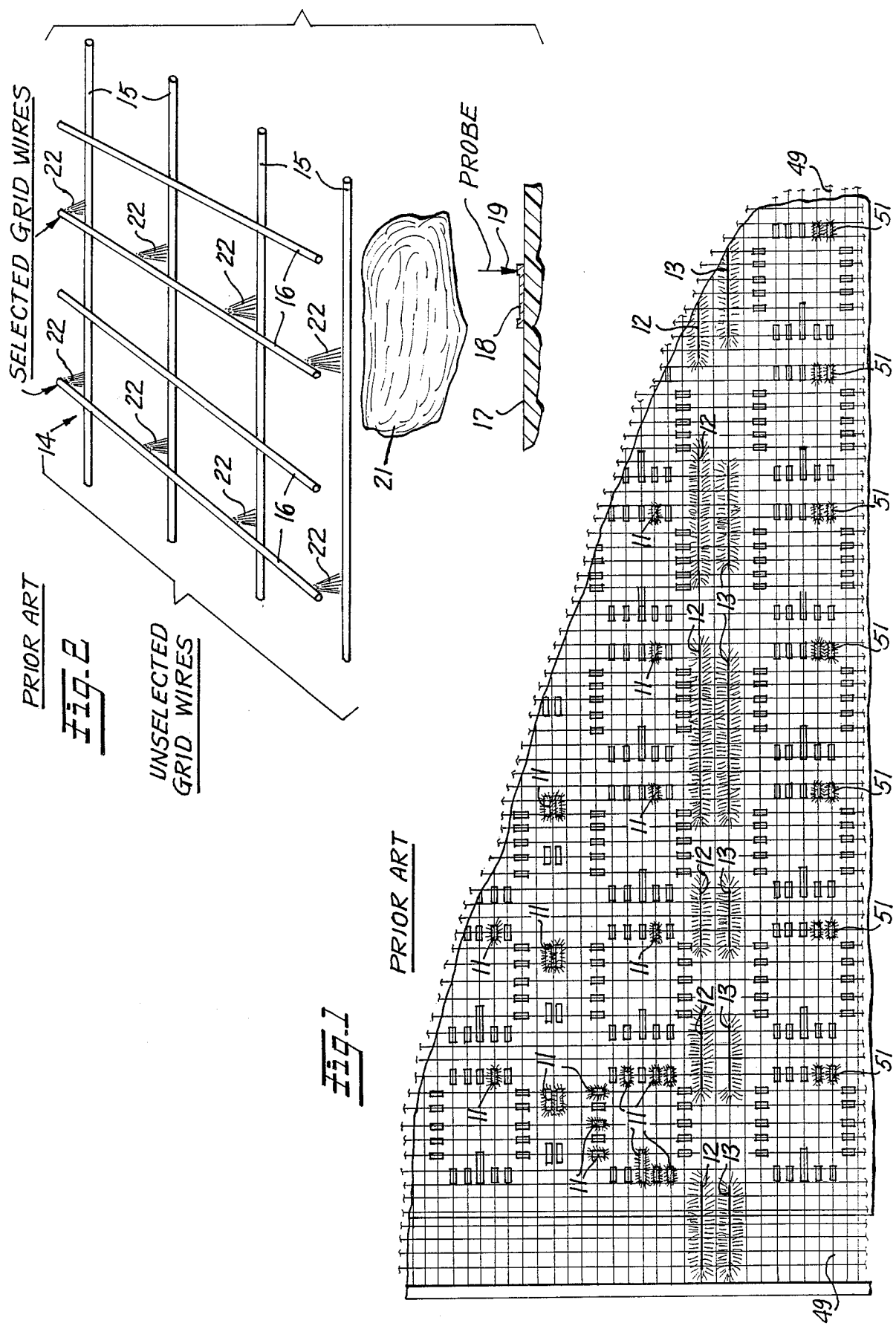

ELECTRO-LUMINESCENT AUTOMATIC TESTING APPARATUS AND METHOD FOR CERAMIC SUBSTRATES, PRINTED CIRCUIT BOARDS AND LIKE ITEMS WITH BACKGROUND ILLUMINATION SUPPRESSION

FIELD OF INVENTION

This invention relates to the field of automatic inspection and testing of unpopulated printed circuit boards, ceramic substrates and other like items which have electrically conductive pathways, pads and other exposed conductive surfaces for electrical continuity and absence of cracks (open circuits), undesired connections (shorts) and other similar imperfections.

More particularly, the invention relates to an improved method and apparatus for electrical and optical inspection and testing of unpopulated printed circuit boards, ceramic substrates, and other like items wherein examination and testing is accomplished by placing a test item within a gastight sealable chamber which contains a gaseous atmosphere capable of electro-luminescence at low pressures such as argon, neon and like gases. The sealable chamber includes a transparent partition which allows optical viewing of the printed circuit board or other item under test either visually by an operator or by an automatically operated electro-optical scanning photometer, vidicon tube, image orthocon tube or other similar TV camera-like devices. In known testing equipment of this nature, a transparent electrically conductive grid of fine wire is disposed between the test item and the transparent partition. One terminal of a source of excitation electric potential is connected to the transparent conductive wire grid and the other terminal is applied to one of the metallic runs or paths on the surface of the sample item to be tested by means of a movable probe. The electric field produced between the metallic run or path on the sample item being tested and the transparent conductive grid in the sealed chamber, causes the gaseous vapor introduced into the chamber immediately adjacent the run to emit light or other electromagnetic radiation in accordance with the well known electro-luminescence phenomenon. The light emissions pattern thus produced forms an image which matches in size and shape the conductive path, pad or run on the sample item which has been electrically excited. The observed pattern is then compared to a known or desired pattern to determine whether it meets a preset standard.

BACKGROUND OF INVENTION

U.S. Pat. No. 4,507,605, issued Mar. 26, 1985 for a "Method and Apparatus for Electrical and Optical Inspection and Testing of Unpopulated Printed Circuit Boards and Other Like Items"—assigned to Testamatic Corporation of Lathem, N.Y. describes a novel method and apparatus for the electrical and mechanical inspection and testing of unpopulated electronic printed circuit boards, ceramic substrates and other like items which have conductive paths formed thereon together with interconnecting pathways and other conducting surfaces. This method and apparatus employs a low presure gaseous atmosphere contained within a sealed chamber for producing electro-luminescence around the conductive pads, pathways, and other conductive surfaces in the manner described briefly above, and employs a transparent grid of fine conductor wires used in conjunction with a movable probe to produce an electric field across the gaseous atmosphere within the test chamber.

An important feature of this novel method and apparatus for testing unpopulated circuit boards, etc. in the above briefly-discussed manner, is the provision of a high speed, low mass movable probe suitable for use in the sealable test chamber and which is described in U.S. Pat. No. 4,527,119, issued July 2, 1985 for a "High Speed, Low Mass, Movable Probe and/or Instrument Positioner, Tool and Like Items Suitable for Use in a Controlled Environment Chamber", assigned to Testamatic Corporation of Latham, N.Y.

FIG. 1 is a partial plan view of what an observer would see while looking through the transparent partition of the testing equipment described in U.S. Pat. No. 4,507,605 under conditions where a sample test printed circuit board was being tested with the chamber filled with a gaseous vapor and suitable electrical excitation potential applied between the transparent fine wire grid and certain selected conductive pads upon the exterior surface of the test circuit board which are exposed to the low pressure gaseous vapor. As described briefly above and in more detail in U.S. Pat. No. 4,507,605, electro-luminescence will occur within the chamber over those conductive pads, pathways, and other conductive surfaces which are being contacted by the movable probe and all such electrically conductive surfaces having electrical continuity with the pad being contacted by the movable probe and which also have conductive surfaces exposed to the gaseous vapor. A number of such conductive pads which produce this electro-luminescent effect are illustrated at 11 in FIG. 1 by the use of little spurs or short lines projecting outwardly from the surface of such pad to depict light emissions. During the testing of any particular printed circuit board, or the like, it will be known in advance which of the particular pads, such as those illustrated at 11, should be lighted up when the movable probe contacts a selected pad as a result of the particular design of the board under test. By optically scanning the entire surface of the board for each particular setting of the movable probe, using television vidicon, image orthocon, or other TV camera tube or scanning photometer, and comparing the observed pattern to programmed information stored in a control computer, it can be determined whether or not the proper pads are being illuminated for any particular setting of the movable probe. In the event that all of the pads which should but are not electro-luminescing (indicative of a crack or open circuit) or undesired additional pads are electro-luminescing (indicative of the existence of a short), it readily can be determined automatically whether or not faults exist in the particular board being tested. For a more detailed description of the phenomenon whereby automatic testing in this manner employing electro-luminescence is achieved, reference is made to the above-noted U.S. Pat. Nos. 4,507,605 and 4,527,119, the disclosures of which hereby are incorporated in their entirety into the disclosure of this application.

One of the problems that has been encountered in practice with automatic test equipment employing electro-luminescence in the above-briefly described manner, has been the production of undesired background noise illumination within the test chambers as indicated by the somewhat continuous lines of illuminated fine conductor wires such as shown at 12 and 13 in FIG. 1. These illuminated conductor wires 12 and 13 in fact comprise part of the transparent, conductive grid which is used to impress the electric field across the gaseous vapor within the sealable chamber in order to achieve the electro-luminescent effect. Under test conditions where undesired background noise illumination such as illustrated at 12 and 13 is sufficiently bright, the automatically operating electro-optical scanning equipment for reading out the light patterns, may improperly read the undesired noise background illumination as an excited pad or other conductive surface on the test specimen thereby producing a false read-out and impairing the validity of the test.

FIG. 2 is an exploded, partial perspective view of the interior of the test chamber and illustrates a portion of the transparent, fine wire grid, shown generally at 14, which is disposed within the sealable test chamber under the transparent partition. In the known test apparatus, the grid 14 is comprised by a first set of parallel, fine conductor wires 15 having exposed conductive surface and a second set of parallel, fine conductor wires 16, also having exposed conductive surfaces, with the second set 16 being lying transversely at right angles to and spaced apart from the first set of parallel conductor wires 15. As shown in FIG. 2, the transparent conductive grid 14 is disposed over a test specimen printed circuit board 17 having a conductive pad 18 formed thereon which is contacted by the movable probe 19. Upon electrical excitation of the probe 19 with a negative polarity electric potential and excitation of the fine wire grid 14 with a positive polarity potential, an electric field is produced across gaseous vapor (indicated by the cloud 21) contained within the test chamber so as to induce an electro-luminescent light effect over conductive pad 18 (as well as all other exposed conductive pads, runways, etc., having electrical continuity with the pad 18 and also exposed to the gaseous vapor 21.

During operation in the above briefly-described manner, selected ones of either the parallel grid wire set 15, or selected ones of the parallel grid wire set 16 will be electrically excited (indicated as selected grid wires), and the parallel conductor grid wires of the transversely disposed set 15 are not energized (unselected). Because of the above-briefly described arrangement of selected (electrically excited) and unselected (neutral or ground potential) grid wires, an electric potential difference will exist between the selected grid wires and the transversely arrayed unselected grid wires which pass under them as indicated by the electric field lines 22 in FIG. 2. Those transversely arrayed ground potential (unselected) grid wires 15 which pass under the excited (selected) grid wires can and do become electrically charged through the gaseous media, and if the phenomenon is sufficient to induce a significant charge on the thus coupled unselected grid wires, then the effect illustrated at 12 and 13 in FIG. 1 and described briefly in the preceeding paragraphs, occurs. The occurrance of this undesired noise background illumination thus obscures and adversely affects the results of the automatic test being conducted. In order to reduce and obviate the effects of such undesired background noise illumination in an electro-luminescent type of automatic testing equipment, the present invention was devised.

SUMMARY OF INVENTION

It is therefore a primary object of the present invention to provide an improved apparatus and method for suppression of undesired background illumination in automatic electro-optical testing equipment of the type which employs electro-luminesence to identify and locate the existence of faults occurring on unpopulated printed circuit boards, ceramic substrates and other like items.

In practicing the invention, an electro-optical testings apparatus employing gaseous discharge within a sealable substantially gastight chamber for electrical testing of items such as printed circuit boards, ceramic substrates, and other like items, is provided. The sealable chamber has a readily opened and closed access opening for placement of items under test therein together with means for introducing a gaseous atmosphere capable of electro-luminescence at low pressures into the gastight sealable chamber with an item to be tested in place. Movable probe means are disposed within the sealable chamber for coupling one terminal of a source of electric potential to desired test points located on the surface of a item under test. A unipotential array of parallel conductor wires lying in substantially the same plane within the sealable chamber is disposed over the item under test and spaced apart therefrom. Means are provided for coupling a remaining opposite polarity potential terminal of the source of electric potential to the unipotential array of conductor wires whereby electro-luminescence is produced in the gaseous atmosphere within the sealable chamber around the test points contacted by the probe means and around all the conductive points on the item under test having electrical continuity therewith which are exposed to the gaseous atmosphere.

Using electro-luminescent type testing equipment having the above set forth characteristics, the invention further makes available a method for testing ceramic substrates, printed circuit boards and other like items which have electrically conductive interconnected parts, pads, pathways, and surfaces for the existence of discontinuities (breaks), undesired conductive areas (shorts) or other irregularities in size or shape. The method uses electro-luminescence to produce in a gaseous atmosphere contained within the sealable, substantially gastight test chamber (within which an item under test is supported) in a manner such that the item can be optically viewed through a transparent partition as noted briefly above. The testing system includes a transparent, unipotential array of parallel conductor wires lying in substantially the same plane and arrayed within the sealable chamber over an item under test and spaced apart therefrom. The transparent, unipotential array of parallel conductor wires is employed in conjunction with movable probe means for contacting selected points on the item under test to produce an excitation electric field across the gaseous atmosphere and thereby induce electro-luminescence therein.

The novel method comprises introducing an item under test into the interior of the test chamber and sealing it closed in a substantially gastight manner. The gaseous atmosphere capable of electro-luminescence at low pressure is then introduced into the interior of the test chamber along with the item under test. One terminal of a source of excitation electric potential is then applied via a movable probe means to selected test points located within an x-y plane on the surface of the item under test. An opposite polarity potential terminal of the source of electric potential is connected to the unipotential array of parallel conductor wires whereby electro-luminescence is produced within the chamber around the test points contacted by the movable probe means and around all conductive surfaces on the item under test having electrical continuity with such test points and which are exposed to the gaseous atmosphere. The method is completed by optically scanning the x-y surface of the item under test during each unique connection of the movable probe means with an electro-optical automatic scanning photometer to identify the location of electrically excited luminescent areas on the item under test. Preferably, the scanning by the automatic scanning photometer is performed by conducting an essentially elongated, continuous x-y scan in a direction extending along axes parallel to the lengthwise direction of the unipotential array of parallel conductor wires and including a short step at the end of each elongated continuous scan path in a direction transverse to the lengthwise direction of the array of parallel conductor wires. The elongated continuous scanning by the automatic scanning photometer preferably is in the form of a continuous, elongated series of short step-wise scanning steps with each scanning step being substantially equal in dimension to the short step in the transverse direction at the end of each elongated continuous series of step-wise scanning steps. As a result, the automatic scanning photometer during operation produces output pulsed waveform electric signals representative of electro-luminescent light producing areas on the surface of the item under test.

The testing system further includes a control computer for controlling the step-wise x-y scanning of the automatic scanning photometer over the surface of an item under test for receiving and processing the electric output signals supplied from the output of the automatic scanning photometer. The control computer during processing of the output pulsed waveform electric signals from the automatic scanning photometer compares the output pulsed waveform electric signal to a prestored, pulsed signal waveform pattern and derives an output indication of whether the two pulsed waveform signals are substantially similar as a go, no-go indication of the acceptability of a circuit board under test.

BRIEF DESCRIPTION OF DRAWINGS

These and other objects, features and many of the attendant advantages of this invention will be appreciated more readily as the same becomes better understood from a reading of the following detailed description, when considered in conjunction with the accompanying drawings, wherein like parts in each of the several figures are identified by the same reference character, and wherein:

FIG. 1 is a partial, plan view of the surface of a printed circuit board, ceramic substrate or other like item under test within the gas-filled chamber of an electro-luminescent type test epuipment known in the prior art;

FIG. 2 is a exploded, partial illustration of a transparent, grid wire arrangement used in prior art electro-luminescent type test equipment and is illustrative of the source of background noise illumination of the type depicted in FIG. 1;

BEST MODE OF PRACTICING THE INVENTION

Figure 3:
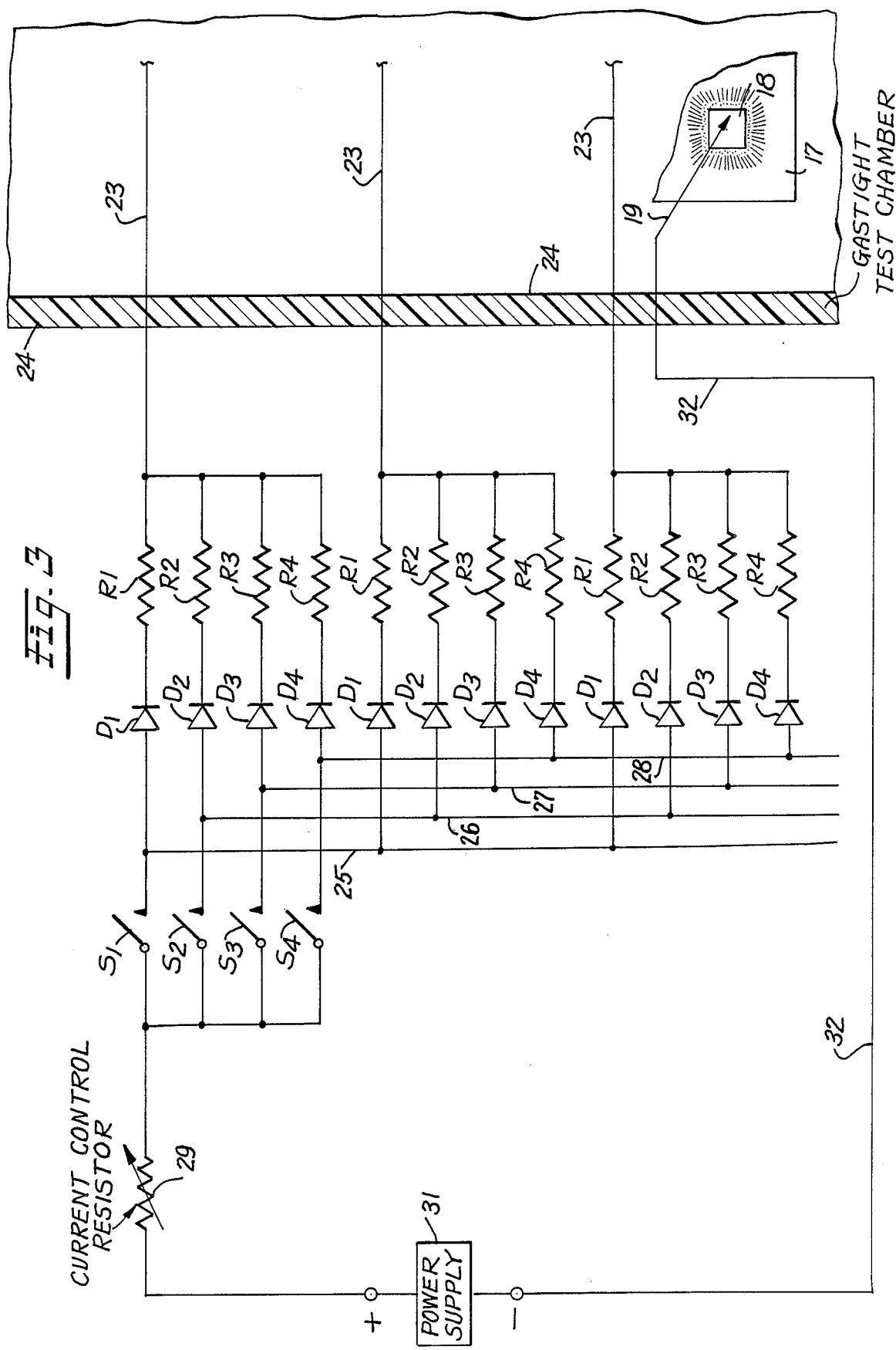
FIG. 3 is a partial, schematic electric wiring diagram functionally illustrated in association with a sealable test chamber employed in an improved electro-luminescent type test apparatus, and illustrates a preferred construction for the transparent conductive wire array employed in such electro-luminescent type test apparatus.

FIG. 3 is a schematic functional circuit diagram illustrating a preferred construction for a transparent, unipotential array of fine, parallel conductor wires 23 which are supported within the interior of the sealable, gastight test chamber 24. The unipotential array of parallel conductor wires 23 is fabricated from extremely fine, highly conductive, high tensile strength wire each of which is only a fraction of a millimeter in diameter. The surfaces of the conductor wires 23 are exposed to the gaseous atmosphere within test chamber 24 and are supported within the test chamber 24 in spaced-apart, parallel relationship within a single plane that is essentially parallel to the surface of a test specimen (shown at 17) inserted within the test chamber. In FIG. 3, the array 23 is depicted as it would appear to an observer looking down through the transparent partition of the electro-luminescent test apparatus upon a test specimen supported within the apparatus (in the same manner as depicted in FIG. 1). Because of the extremely fine nature of the conductor wires 23 and the distance by which they are spaced apart relative to each other, the array of wires is transparent and readily may be seen through so that it does not obscure the view of an observer or an automatic scanning photometer, vidicon, orthocon or other television camera-type device for automatically scanning the surface of the test specimen 17 as described earlier with relation to FIG. 1 of the drawings.

As shown in FIG. 3, each conductor wire 23 is connected through a selectively switched, voltage selecting resistor R1, R2, R3, or R4 via a selectively operated selector switch S1, S2, S3 or S4. The voltage selecting resistors R1 all are identical in resistor value and are calibrated to provide a selected value of electric potential to their respective conductor wire 23 via the commonly connected selector switch S1. A common supply line conductor 25 connects all of the voltage selecting resistors R1 and their associated conductor wires 23 in parallel circuit relationship to one terminal of the selector switch S1. Similarly, a plurality of second voltage selecting resistors R2 which are of identical value but different from R1 are provided which supply a different electric potential to the conductor wires 23 from that applied through voltage selecting resistor R1 via a common supply line conductor 26 and commonly connected selector switch S2. The selector resistors R3 likewise are all of identical value and designed to provide still a third electric potential value to the conductor wires 23 via a common supply line conductor 27 and a common selector switch S3. The selector resistors R4 likewise are identical in value and adjusted to provide a fourth different potential value to the conductor wires 23 via the common supply line conductor 28 and selector switch S4. All of the selector switches S1, S2, S3 and S4 are connected in common through a common current control resistor 29 to the positive terminal of an energizing electric potential power supply 31. The remaining, opposite polarity, negative terminal of power supply 31 is connected through a power supply conductor 32 to the movable probe 19 in the manner explained more fully in U.S. Pat. No. 4,527,119.

From the above brief description, it will be appreciated that for any given set of operating parameters the value of the electric excitation potential applied to the respective parallel conductor wires 23 is the same for all conductor wires due to the common interconnection through the respective commonly connected supply conductors 25, 26, 27 or 28 and the common selector switches S1, S2, S3 or S4. Thus, it will be appreciated that the array of conductor wires 23 all are at the same potential (unipotential), the value of which is determined by which voltage selecting resistor R1, R2, R3 or R4 is selectively switched into circuit relationship with the respective conductor wires 23 by the associated common selector switch S1, S2, S3 or S4. This in turn determines the value of the electric field produced across the gaseous atmosphere introduced within the sealable gastight chamber 24 and to a great extent controls the electro-luminescence effect produced around the selected conductor pads which are selectively electrically energized by the movable probe 19 in the manner described earlier.

It should also be noted at this point that various combinations of the voltage selecting resistors such as R1 and R2 can be connected in parallel-series circuit relationship with the conductor wires 23 by appropriate selection of both commonly connected selector switches S1, S2. Under such conditions, the value of the electric potential supplied to the respective conductor wires 23 would be determined by the combined parallel resistance values of the voltage selecting resistors R1 and R2. Other arrangements such as the combined values of R1 and R4 and R2 and R3, R1 plus R2 plus R3, etc., are possible. In order to assure close control over the selected values of the voltage selecting resistors R1, R2, R3 and R4 in this manner, current blocking diodes D1, D2, D3 and D4 are connected in series circuit relationship between the commonly connected selector switches S1, S2, S3 and S4 and the end of the respective voltage selecting resistor R1, R2, R3 and R4 that otherwise would be connected to its respective associated selector switch. In this manner, undesired parallel coupling paths through the common supply conductors 25, 26, 27 and 28 are avoided. It should be further noted that while the selector switches S1, S2, S3 and S4 are indicated as being manually operated switches, these switches in practice could comprise switching transistors which readily could be automatically controlled by a central controller via a control computer comprising a part of the overall testing system as will be described hereafter with relation to FIG. 4.

Figure 4:
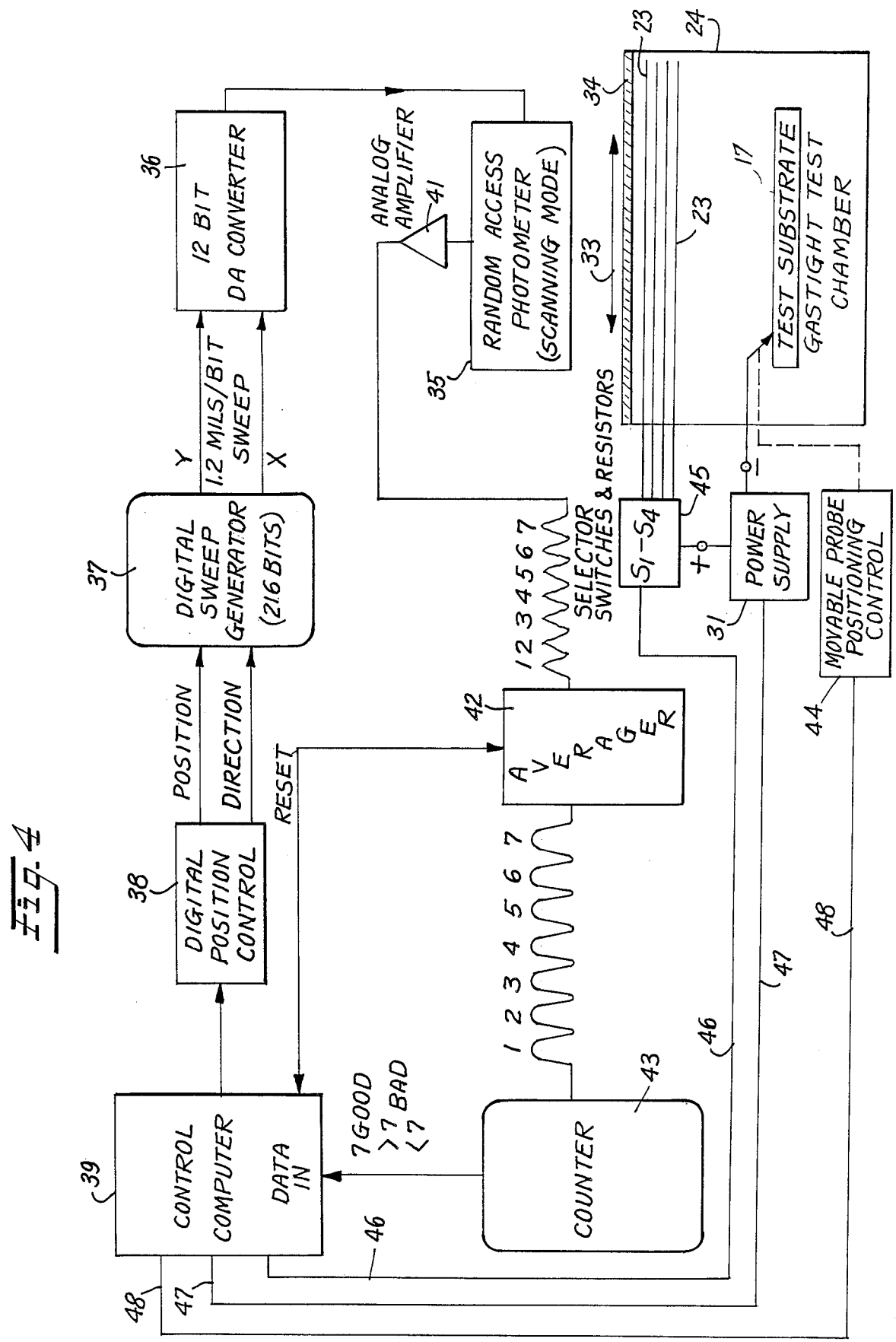
FIG. 4 is a functional block diagram of an overall electro-luminescent type test equipment and illustrates a preferred method of operation for the apparatus according to the invention.

FIG. 4 is functional block diagram of a preferred form of control system for the improved electro-luminescent type inspection equipment according to the invention for further reducing and minimizing the effects of undesired background noise illumination while using the inspection equipment. In FIG. 4, the sealable gastight test chamber is shown at 24 having a test substrate 17 supported therein below the transparent unipotential array of elongated conductor wires 43 that in turn is below the transparent partition or top 34 to the sealable gastight test chamber 24. An automatically controlled random access scanning photometer 35 is positioned over the transparent partition 34 of test chamber 24 which is of conventional, commercially available construction.

The random access photometer 35 is operated in its scanning mode with the scanning of the photometer being automatically controlled to essentially scan along an elongated, continuous, step-wise scan path in the direction of the arrows 33 which extends along axes parallel to the lengthwise direction of the array of parallel conductor wires 23. At the end of each elongated continuous stepwise scanning path, a short step is performed at the end of each continuous scanning path in a direction transverse to the lengthwise direction of the array of parallel conductor wires 23 (which would be along the axes extending into the plane of the paper as observed by a reader). In this manner, a complete x-y scan of the surface of the test printed circuit board or ceramic substrate, or other like item automatically is performed by the automatic scanning photometer 35 during each test setting of the movable probe 19. After each such scan, the movable test probe 19 is moved to a new test position via a movable probe positioning control 44 under the command of the central control computer 39. A complete x-y scan of the surface of the test substrate 17 then again is repeated automatically by the scanning photometer 35 for each setting of movable probe 19. The repeated x-y planar scanning of the surface of the test substrate in this manner is under the command of the central control computer 39 via a digital position controller 38 which receives its commands from the control computer 39 and in turn controls both the position and direction of scanning of a digital sweep generator 37 whose output is supplied through a twelve bit digital analog converter 36 to control the scanning operation of the automatic scanning photometer 35.

Output signals derived by the automatic scanning photometer 35 are supplied through an analog amplifier 41 to an averaging circuit 42 which in effect serves as a filter for improving the waveshape of the generally pulsed waveform output signal derived at the output of the automatic scanning photometer 35. The filtered output from the averaging circuit 42 is applied to a counter 43 which in effect counts the number of pulses occurring in each pulsed waveform signal supplied from the output of scanning photometer 35 over a period corresponding to one of the elongated scanning path traces. The output from the counter 43 is supplied back to the data input of control computer 39 for comparison to a preset standard count which should appear in the pulsed waveform signal in question if the printed circuit board, ceramic substrate or other item under test conforms to its design standards.

In addition to the above briefly described features, the control computer 39 also automatically controls the setting of the selector switches S1, S2, S3 and S4 shown at 45 (described with relation to FIG. 3 of the drawings) over the control conductor 46. Control computer 39 also controls turn-on and the turn-off of the power supply 31 via control conductor 47 for controlling the application of electric energizing potential from power supply 31 across the movable test probe 19 and the unipotential, transparent array of parallel conductor wires 23. As mentioned earlier, control computer 39 also directly controls over control conductor 48 the positioning control 44 for movable probe 19. In addition to these functions, control computer 39 also controls the purging of the interior of test chamber 24 after completion and removal of an individual test substrate 17 followed by introduction of the next speciment to be tested, evacuation and introduction of the new gaseous media into the test chamber for the new test substrate in the manner described more fully in the above-noted U.S. Pat. No. 4,507,605. For the sake of simplicity, the specimen access door and means for conducting the gas purge, evacuation and introduction of a new gaseous medium into the chamber automatically by control computer 39 has not been illustrated in FIG. 4.

Operation of the control system of FIG. 4 is as follows. An access panel or door on the side of sealable test chamber 24 (not shown) is opened after the interior of the chamber has been purged and returned to atmospheric pressure. At this point, the test substrate previously tested is removed and a new test substrate 17 is introduced into the chamber. The access panel then is closed and sealed and such fact is communicated automatically to the control computer 39. At this point, the interior of the chamber automatically is evacuated and subsequently, a charge of gaseous medium capable of electro-luminescence at a low pressure is introduced into the interior of the chamber. The control computer then commands the movable probe positioning control 44 to move probe 19 to a particular identified test position to initiate testing of the substrate. For any given specimen there may be as many as 200–300 such positions in order to complete testing of all of its conductive pads, runs, pathways and other exposed surfaces of the substrate or PCB. After setting of the movable probe 19 to a desired particular test location, selector switches S1-S4 are appropriately opened and/or closed to provide a desired potential difference across the gaseous medium between the unipotential array of conductor wires 23 and the exposed, electrically excited surfaces on test substrate 17 upon power supply 31 being activated by control computer 39. Thereafter, automatic scanning photometer 35 is caused to scan in an x-y plane across the surface of test substrate 17 in the manner described earlier above and to derive the pulsed waveform signal output supplied through analog amplifier 41 and averager 42 to counter 43.

For the purpose of illustration, consider that the automatic scanning photometer 35 is caused to scan in a stepwise manner along an elongated, continuous path such as that shown at 49 in FIG. 1, for example. As the view of the scanning photometer automatically is caused to trace from left to right across this path, it will alternately view the electrically excited and therefore electro-luminescent points 51 periodically along its path of travel. Since in this example there are only seven somewhat evenly separated electro-luminescent points 51 along the path 49, the output of the scanning photometer will appear as shown by the pulsed waveform electric signal illustrated in FIG. 4 as having seven sequential peak amplitude pulses that are filtered in averaging circuit 42 and supplied to counter 43. Counter 43 will count the seven pulses and supply an output to control computer 39 indicating that along the particular path in question there were seven electrically excited, conductive, pads viewed by the automatic scanning photometer. The computer will then compare the seven pulse count to a count that has been prestored in its memory for the particular observation path in question. In this case there were seven pulses for the scanning path in question and since there should have been only seven, the test specimen is good for that particular location. Had there been more or less than seven pulses, the computer would have indicated that the test specimen was bad at that particular location, and then would identify to an operator of the test equipment the particular location where the test specimen was bad.

From the above brief description, it will be appreciated that by appropriately instructing the automatic scanning photometer 35 to conduct its main, elongated continuous step-wise scanning path along an axis which is parallel to the axes of the transparent unipotential array of parallel conductor wires 23, the possibility of undesired background illumination noise triggering a false response can be substantially eliminated through data processing in the control computer. For example, should any one of the individual conductor wires be broken or otherwise develop an open circuit so that it is at some potential other than the remaining wires, the phenomenon explained with relation to FIG. 2 of the drawings could occur whereby any such open circuited wire could become lighted in the manner explained with relation to the lighted scan paths 12, 13 shown in FIG. 1 of the drawings. In this event, it need not be fatal to the runs accomplished with respect to the test equipment prior to the failure of the bad conductor wire or its being discovered. By appropriate data processing as explained above, the effects of the continuously illuminted wire can be cancelled out from the test results by the control computer. This is due to the fact that as the automatic scanning photometer 35 traces along a substantially continuously illuminated broken wire such as shown at 12 and 13 in FIG. 1, its output signal instead of being pulsed would be substantially at a continuous high value as opposed to the pulsed type signal that it should see at the points in question. The occurrance of such a high value for such a continuous period of time serves to notify the operator of the possibility of an open circuit or bad connector wire so that the test equipment can be checked and the conductor wire repaired. In the interim, however, the test thus far run need not be discarded since the undesired noise background signal readily can be identified and discriminated against in the data processing by the control computer. Hence, it will be appreciated that in accordance with the invention, not only can the electro-luminescent type test equipment be designed so as to avoid the occurrance of undesired background noise illumination being produced within the equipment as a result of use of cross wire grid arrangement, but that by appropriate programming, the system can be operated to screen out possible noise background illumination effects that might develop during the course of a test run.

INDUSTRIAL APPLICABILITY

From the foregoing description it will be appreciated that the invention provides an improved automatically operated test apparatus and method for suppression of undesired background noise illumination in automatic electro-optical testing equipment of the type which employs electro-luminescence to identify and locate the existence of faults occurring on unpopulated printed circuit boards, ceramic substrates, and other like items.

Having described a preferred embodiment of an improved automatic testing apparatus and method for suppression of undesired background illumination in automatic electro-optical testing equipment which employs electro-luminescence in accordance with the invention, it is believed obvious that changes may be made in the particular embodiment of the invention described which are within the full intended scope of the invention as defined by the appended claims.

What is claimed is:

1. An electro-optical testing apparatus employing gaseous discharge within a sealable substantially gastight chamber for the testing of items such as printed circuit boards, ceramic substrates and other like items for electrical continuity, said chamber having a readily opened and closed access opening for placement of items under test therein, means for introducing a gaseous atmosphere capable of electro-luminescence at low pressures into the sealable chamber with an item to be tested in place, movable probe means disposed within the sealable chamber for coupling one terminal of a source of electric potential to desired test points located on the surface of an item under test, a unipotential array of parallel conductive wires lying in the same plane within the sealable chamber over the item under test and spaced apart therefrom, and means for coupling a remaining opposite polarity potential terminal of said source of electric potential to the unipotential array of conductive wires wherein each individual conductive wire is suitably connected with a plurality of different value voltage limiting resistors each of which are selectively placed in operating series electrical circuit relationship with the respective conductive wire by a respective selector switch connected between each respective voltage limiting resistor and the remaining opposite polarity terminal of said source of electric potential, whereby any particular desired value voltage limiting resistor may be selectively connected in series circuit relationship with the respective electrical conductive wire by selective operation of the respective selector switch, whereby electro-luminescence is produced in the gaseous atmosphere within the sealable chamber around test points contacted by asid probe means and around all conductive points on the item under test having electrical continuity therewith which are exposed to the gaseous atmosphere with a minimum background noise light illumination.

2. An electro-optical testing apparatus according to claim 1 further including respective blocking diodes connected in series circuit relationship between each selector switch and its respective series connected voltage limiting resistor for preventing establishment of parallel conductive paths supplying the respective conductor wires in addition to a desired selected path through a particular value voltage limiting resistor.

3. An electro-optical testing apparatus according to claim 2 further including a commonly connected, variable current controlling resistor connected in series circuit relationship between the source of electric potential and all of the voltage limiting resistors and their respective selector switches for selectively controlling the value of a current flowing to all of the conductor wires.

4. An electro-optical testing apparatus according to claim 1 wherein the conductor wires comprising the unipotential array of parallel conductor wires are spaced-apart a sufficient distance between each other within the planar array and are sufficiently fine in cross section so that the array is substantially transparent and readily may be visually seen through by electro-optical viewing instruments.

5. An electro-optical testing apparatus according to claim 3 wherein the conductor wires comprising the unipotential array of parallel conductor wires are spaced-apart a sufficient distance between each other within the planar array and are sufficiently fine in cross section so that the array is substantially transparent and readily may be visually seen through by electro-optical viewing instruments.

6. An electro-optical testing apparatus according to claim 1 wherein the array of parallel conductor wires within the sealable chamber extends within an x-y plane in the same direction as the direction of elongated continuous scanning of an automatic scanning photometer used with the apparatus and wherein the view of the automatic scanning photometer automatically is stepped one step in a direction which is transverse to the direction of elongated continuous scanning at the end of each elongated continuous line of scan and which also is tranverse to the lengthwise direction of the array of conductor wires.

7. An electro-optical testing apparatus according to claim 5 wherein the array of parallel conductor wires within the sealable chamber extend within an x-y plane in the same direction as the direction of elongated continuous scanning of an automatic scanning photometer used with the apparatus and wherein the view of the automatic scanning photometer automatically is stepped one step in a direction which is transverse to the direction of elongated continuous scanning at the end of each elongated continuous line of scan and which also is transverse to the lengthwise direction of the array of conductor wires.

* * * * *